(12) United States Patent (10) Patent No.: US 8,525,549 B1
Feng et al. (45) Date of Patent: Sep. 3, 2013

(54) PHYSICAL UNCLONABLE FUNCTION CELL AND ARRAY

(75) Inventors: Kai D. Feng, Hopewell Junction, NY (US); Hailing Wang, Essex Junction, VT (US); Ping-Chuan Wang, Hopewell Junction, NY (US); Zhijian Yang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/403,339

(22) Filed: Feb. 23, 2012

(51) Int. Cl.
*H03K 19/173* (2006.01)

(52) U.S. Cl.
USPC ............. 326/38; 326/40; 327/108; 330/296

(58) Field of Classification Search
USPC ............. 326/38–40; 327/108, 427; 330/296, 330/285
See application file for complete search history.

(56) References Cited

U.S. PATENT DOCUMENTS

| | | | |
|---|---|---|---|
| 7,633,346 B2 * | 12/2009 | Oishi | ............................ 330/296 |
| 7,653,197 B2 | 1/2010 | Van Dijk | |
| 2007/0038871 A1 | 2/2007 | Kahlman et al. | |
| 2007/0090312 A1 | 4/2007 | Stallinga et al. | |
| 2008/0044027 A1 | 2/2008 | Van Dijk | |
| 2008/0231418 A1 | 9/2008 | Ophey et al. | |
| 2008/0279373 A1 | 11/2008 | Erhart et al. | |
| 2009/0083833 A1 | 3/2009 | Ziola et al. | |
| 2009/0153841 A1 | 6/2009 | Ophey et al. | |
| 2010/0122353 A1 | 5/2010 | Koushanfar et al. | |
| 2010/0127822 A1 | 5/2010 | Devadas | |
| 2010/0146261 A1 | 6/2010 | Talstra et al. | |
| 2010/0293384 A1 | 11/2010 | Potkonjak | |
| 2010/0293612 A1 | 11/2010 | Potkonjak | |
| 2010/0322418 A1 | 12/2010 | Potkonjak | |
| 2011/0002461 A1 | 1/2011 | Erhart et al. | |
| 2011/0234241 A1 | 9/2011 | Lewis et al. | |
| 2011/0254141 A1 | 10/2011 | Roest et al. | |
| 2011/0317829 A1 | 12/2011 | Ficke et al. | |
| 2012/0030268 A1 | 2/2012 | Liu et al. | |
| 2012/0161850 A1 * | 6/2012 | Rangarajan et al. | ........... 327/427 |

FOREIGN PATENT DOCUMENTS

JP 2000307392 A * 11/2000
KR 20100021446 A 2/2010

OTHER PUBLICATIONS

B. Gassend et al., "Controlled Physical Random Functions," Proceedings of the 18th Annual Computer Security Applications Conference (ACSAC '02), copyright 2002 IEEE, pp. 1-12.

(Continued)

*Primary Examiner* — Daniel D Chang
(74) *Attorney, Agent, or Firm* — Cantor Colburn LLP; Ian MacKinnon

(57) ABSTRACT

A function cell comprising a first field effect transistor (FET) device, a second FET device, a first node connected to a gate terminal of the first FET device and a gate terminal of the second FET device, wherein the first node is operative to receive a voltage signal from an alternating current (AC) voltage source, an amplifier portion connected to the first FET device and the second FET device, the amplifier portion operative to receive a signal from the first FET device and the second FET device, a phase comparator portion having a first input terminal connected to an output terminal of the amplifier and a second input terminal operative to receive the voltage signal from the AC voltage source, the phase comparator portion operative to output a voltage indicative of a bit of a binary value.

20 Claims, 8 Drawing Sheets

(56) References Cited

OTHER PUBLICATIONS

D. Puntin et al., "CMOS Unclonable System for Secure Authentication Based on Device Variability," copyright 2008 IEEE, pp. 130-133.
J. Guajardo et al., "Physical Unclonable Functions and Public-Key Crypto for FPGA IP Protection," copyright 2007 IEEE, pp. 189-195.
J. Li et al., "At-Speed Delay Characterization for IC Authentication and Trojan Horse Detection," 2008 IEEE International Workshop on Hardware-Oriented Security and Trust, Anaheim, CA, Jun. 9, 2008, pp. 1-4.
K. Lofstrom et al., "IC Identification Circuit Using Device Mismatch," 2000 IEEE International Solid-State Circuits Conference, copyright 2000 IEEE, pp. 1-2.
S. Maeda et al., "An Artificial Fingerprint Device (AFD): A Study of Identification Number Applications Utilizing Characteristics Variation of Polycrystalline Silicon TFTs," IEEE Transactions on Electron Devices, vol. 50, No. 6, Jun. 2003, Copyright 2003 IEEE, pp. 1451-1458.
S. S. Kumar et al., "Extended Abstract: The Butterfly PUF Protecting IP on Every FPGA," 2008 IEEE International Workshop on Hardware-Oriented Security and Trust, Anaheim, CA, Jun. 9, 2008, pp. 1-4.
Y. Su et al., "A 1.6pJ/bit 96% Stable Chip-ID Generating Circuit Using Process Variations," 2007 IEEE International Solid-State Circuits Conference, copyright 2007 IEEE, pp. 406-408.
International Search Report and Written Opinion of the International Searching Authority, corresponding PCT Application No. PCT/USA2012/070799, mailed Apr. 30, 2013, pp. 1-10.

\* cited by examiner

PHYSICAL UNCLONABLE FUNCTION CELL AND ARRAY

BACKGROUND

The present invention relates to unclonable functions, and more specifically, to physical unclonable functions.

A physical unclonable function (PUF) is a function that is arranged in a physical structure that is typically easily evaluated, but difficult to predict. A PUF device should be very difficult to duplicate, but relatively simple to fabricate.

A PUF generates a set of bits, for example, 128 bits to form a matrix A. During operation the calculation Y=A*X is performed, where A is a matrix having elements generated from the PUF, X is an input vector called a "challenge," and Y is the output vector called the "response."

The matrix A and the input vector should only be known to the chip owner such that only the owner may know if the response is correct.

Typical PUF characteristics include stable bit generation from the PUF that remain fixed over time, and correlation among the bits generated from similar PUF structures should be random.

SUMMARY

According to one embodiment of the present invention, a function cell includes a first field effect transistor (FET) device, a second FET device, a first node connected to a gate terminal of the first FET device and a gate terminal of the second FET device, wherein the first node is operative to receive a voltage signal from an alternating current (AC) voltage source, an amplifier portion connected to the first FET device and the second FET device, the amplifier portion operative to receive a signal from the first FET device and the second FET device, a phase comparator portion having a first input terminal connected to an output terminal of the amplifier and a second input terminal operative to receive the voltage signal from the AC voltage source, the phase comparator portion operative to output a voltage indicative of a bit of a binary value.

According to another embodiment of the present invention, a method for operating a function cell system includes detecting a transconductance factor (gm) of a first FET device in a first cell of the system and a gm of a second FET device in the first cell of the system, determining whether the gm of the first FET device is greater than the gm of the second FET device, outputting a first voltage signal from the first cell of the system indicating that the gm of the first FET device is greater than the gm of the second FET device responsive to determining that gm of the first FET device is greater than the gm of the second FET device.

According to yet another embodiment of the present invention, a method for operating a function cell system includes providing power to the system, initiating a reading process comprising selecting a first cell from a plurality of cells in the system, detecting and comparing a transconductance factor (gm) of a first FET device and a second FET device in the first cell, receiving a first bit value from the first cell indicative of the comparison of the gm of the first FET device and the second FET device of the first cell, storing the first bit value associated with the first cell, detecting and comparing a transconductance factor (gm) of a first FET device and a second FET device in the first cell, receiving a second bit value from the first cell indicative of the comparison of the gm of the first FET device and the second FET device of the first cell, determining whether the first bit value is the same as the second bit value, stressing a first FET device and a second FET device in the first cell if the first bit value is not the same as the second bit value, and outputting the first bit value responsive to determining that the first bit value is the same as the second bit value.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
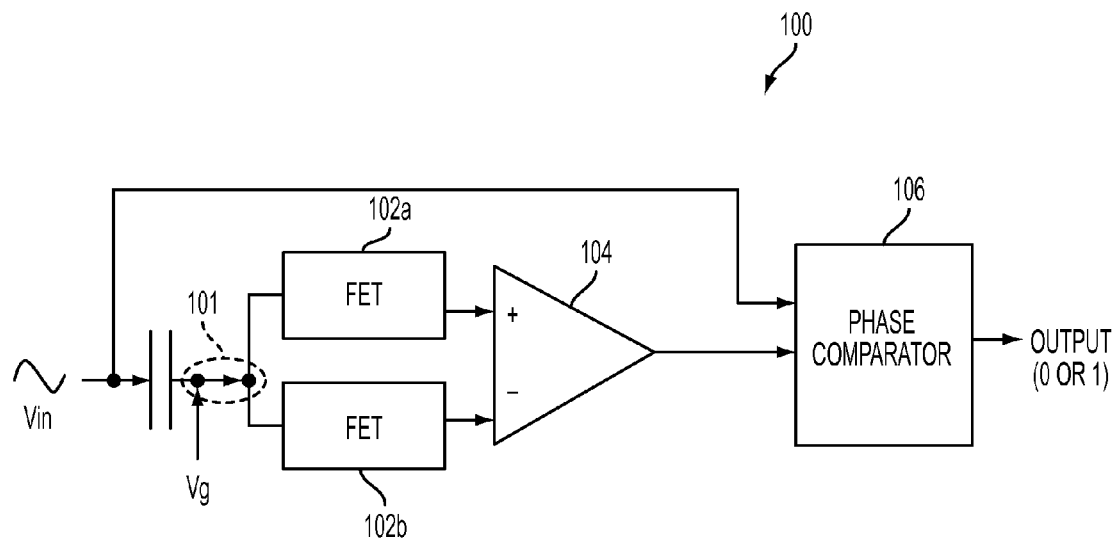
FIG. 1 illustrates a block diagram of an exemplary embodiment of a physical unclonable function (PUF) cell.

FIG. 1 illustrates a block diagram of an exemplary embodiment of a physical unclonable function (PUF) cell 100. The PUF cell (cell) 100 includes a first field effect transistor device (FET) 102a and a second FET 102b. The FETs 102a and 102b are substantially similar in that they have been designed and fabricated such that they each have substantially similar structures and electrical characteristics. For typical electronic applications the FETs 102a and 102b could be considered identical components. However, even if a pair of FETs are intended by a designer and manufacturer to be substantially identical, a pair of substantially identical FETs will exhibit different device parameters due to the randomness of intrinsic physics and manufacturing process. Transconductance factor (gm) is one of the device parameters that differs between devices. In this regard, the gm variations may be determined by two methods, drain gm (D-gm) and body leakage gm (B-gm). More specifically, $D\text{-}gm = d(Ids)/d(Vg)$, where $Ids$=drain current and $Vg$=gate voltage; and $B\text{-}gm = d(Ix)/d(Vg)$, where $Ix$=body leakage current ($Ix$).

Thus, a difference between the gm of the FETs (Δgm) may be calculated. The gate terminals of the FETs 102a and 102b are connected at a node 101 that receives an alternating current (AC) input voltage (Vin), and a gate voltage (Vg). The signals output from the FETs 102a and 102b are received by an amplifier 104. A phase comparator 106 receives the signal output by the amplifier 104, and the Vin signal and outputs a high or low signal (i.e., a 1 or 0 bit) responsive to comparing the input signals. The use of the phase comparator 106 offers greater immunity from noise and interference than, for example, a voltage level detector.

The transconductance factors of each of the FETs 102a and 102b are dissimilar, and are not known during fabrication. Indeed, during fabrication it is very difficult to fabricate identical FETs having identical transconductance factors. It is also difficult to accurately predict or specify relatively exact transconductance factors for similar FETs fabricated on similar chips or wafers using substantially similar fabrication methods. For a given PUF cell 100, the output of the phase comparator 106 is not known until a Vin and Vg are applied to the cell following fabrication. Thus, whether the output is a 0 or 1 for any given PUF cell 100 provided appropriate Vin and Vg signals are applied is effectively or substantially determined at random.

In operation, an array of similar PUF cells 100 may be fabricated on a chip or wafer, where each PUF cell 100 outputs a bit resulting in a binary output that is unique to the chip for particular Vin and Vg signals. The binary output is not known until fabrication of the PUF cells 100 is complete, and is effectively random. Thus, substantially similar or substantially identical arrays of PUF cells 100 may be fabricated on any number of chips, and for particular Vin and Vg signals, the binary outputs should be substantially or effectively random due to the random nature of the variances of the transconductance factors of each of the FETs 102a and 102b in the PUF cells 100 fabricated on the chips.

Figure 2:
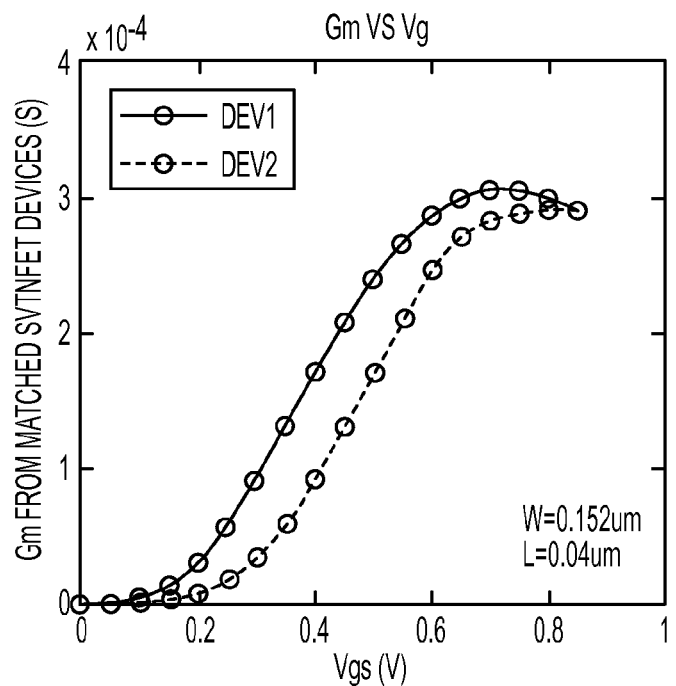
FIG. 2 illustrates an exemplary graph of gm vs. Vg for FETs where the FETs are NFET devices.
Figure 3:
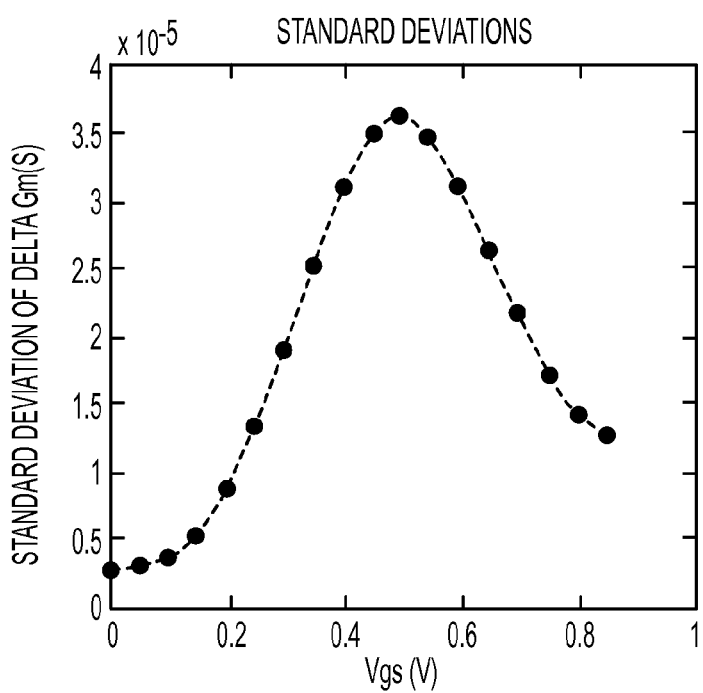
FIG. 3 illustrates the standard deviation of the gm ($\Delta$gm) vs. Vg of one pair of NFETs corresponding to the graph of FIG. 2.

FIG. 2 illustrates an exemplary graph of gm vs. Vg for FETs 102a and 102b where the FETs 102a and 102b are NFET devices. FIG. 3 illustrates the standard deviation of the gm (Δgm) vs. Vg corresponding to the graph of FIG. 2.

Figure 4:
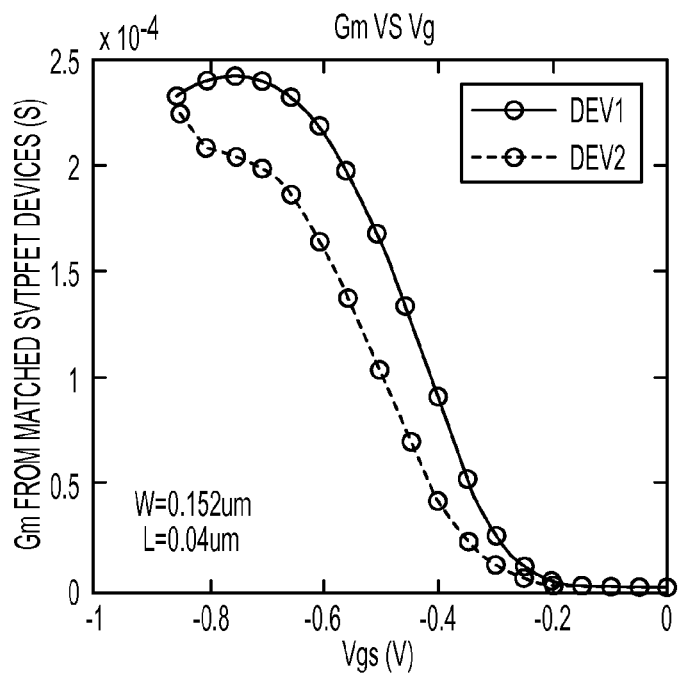
FIG. 4 illustrates an exemplary graph of gm vs. Vg for FETs where the FETs are PFET devices.
Figure 5:
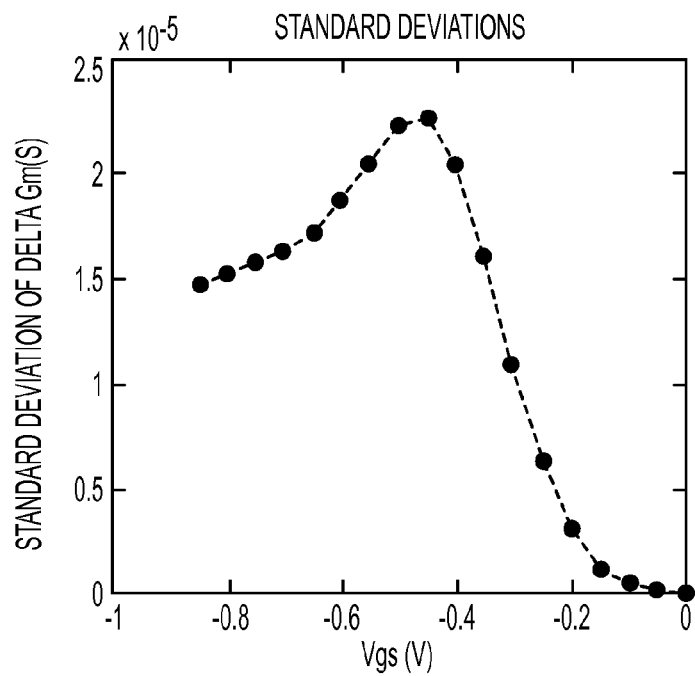
FIG. 5 illustrates the standard deviation of the gm ($\Delta$gm) vs. Vg of one pair of PFETs corresponding to the graphs of FIG. 4.

FIG. 4 illustrates an exemplary graph of gm vs. Vg for FETs 102a and 102b where the FETs 102a and 102b are PFET devices. FIG. 5 illustrates the standard deviation of the gm (Δgm) vs. Vg corresponding to the graphs of FIG. 4.

The graphs illustrated in FIGS. 2-5 illustrate that the gm variation is dependent on the Vg. In this regard, a lower Vg generally results in a larger variation in gm. However, reducing the Vg also reduces the absolute gm value, which reduces the detectability of the gm. A programmable (i.e., a voltage value that may be changed or set to a desired voltage) Vg signal may be used to optimize the PUF cell 100 such that a desired variation in gm and absolute gm value may be achieved.

Figure 6:
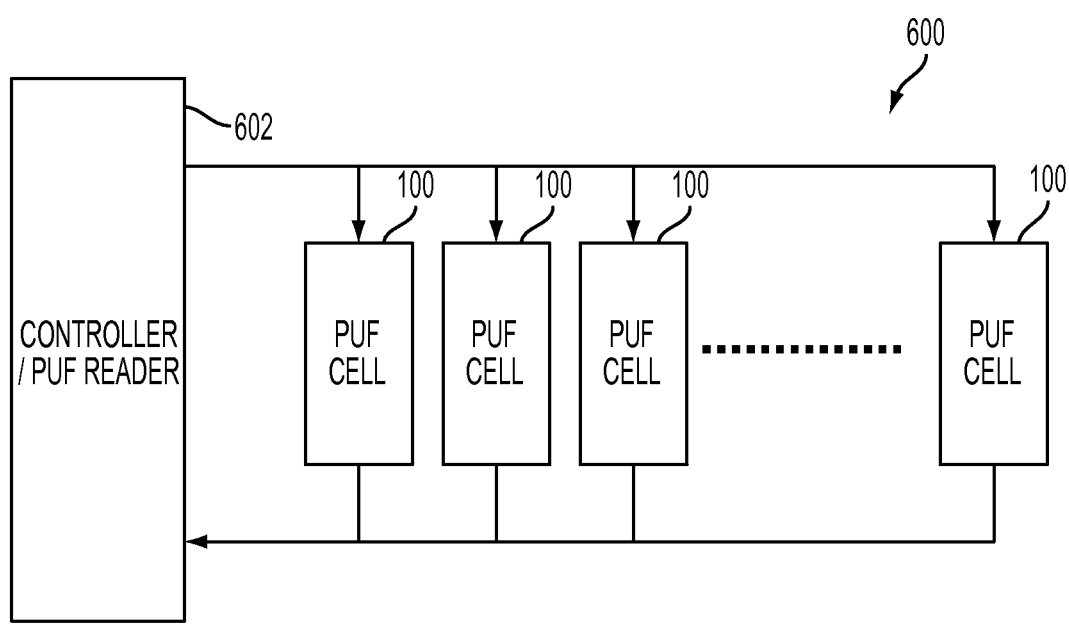
FIG. 6 illustrates a block diagram of an exemplary embodiment of a PUF array.

FIG. 6 illustrates a block diagram of an exemplary embodiment of a PUF array 600. The PUF array 600 may include any number of PUF cells 100 that are connected to a controller and reader portion (controller portion) 602. The number of bits output by the PUF array 600 corresponds to the number of PUF cells 100 in the PUF array 600. The controller portion 602 is operative to output Vin and Vg voltages to the PUF array 500 and read the resultant bits output by each PUF cell 100 in the PUF array 600.

Figure 7:
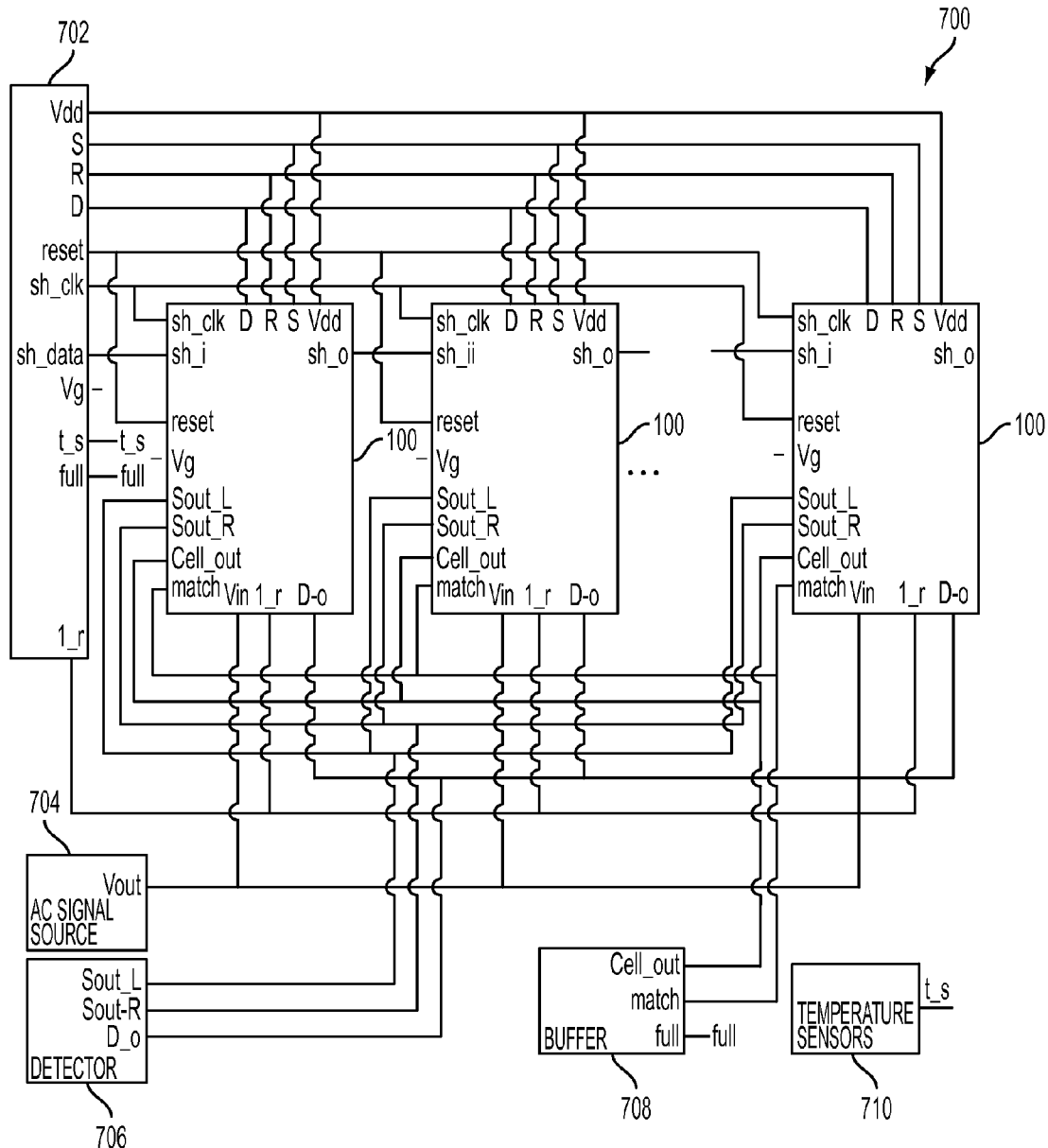
FIG. 7 illustrates a block diagram of an exemplary embodiment of a PUF array system.

FIG. 7 illustrates a block diagram of an exemplary embodiment of a PUF array system (system) 700. The system 700 includes a controller 702 that is connected to a plurality of PUF cells 100. The PUF cells 100 are connected to an AC signal source 704, a detector portion 706, and a buffer portion 708. The system 700 may also include a temperature sensor portion 710. The number of cells 100 may be greater than a desired number of bits that are desired to be output by the system 700. For example, for a desired 128 bit output, the system 700 may include 200 cells 100. Such an arrangement offers redundancy and provides for the selection of stable cells 100.

In exemplary operation, the controller 702 provides a power supply voltage Vdd that may be a normal operation voltage or a stress voltage (described below) depending on the operational mode of the system 700. The controller 702 provides the gate voltage Vg that may set the DC operation point of a cell 100 for an optimal working condition. The controller sets three operational modes: detection, read, and stress that are set by the output signals D, R, and S.

In detection mode, the cells 100 are enabled sequentially, and the output signals (Sout_L and Sout_R) from each of the FETs in the cell are received by the detector portion 706. The detector portion 706 compares the signals and feeds back the result to the cell 100. For example, if the Sout_L signal is larger than the Sout_R signal the detector portion 706 feeds a signal (D_o) of logic high to the cell 100, likewise, if the Sout_L signal is smaller than the Sout_R signal, a logic low signal is fed to the cell 100. The logic status is the output logic status of the cell 100. After K number of detection cycles, where each cell 100 has been detected K number of times, the system 700 enters the read mode.

In the read mode, the outputs of a cell 100 are considered effective if the logic status of the cell 100 remains the same over K number of cycles (i.e., the logic status of the cell 100 remains stable over time.) The buffer portion 708 reads all effective output signals of the cells 100. If the number of the effective outputs does not reach the desired number of effective outputs (i.e., the number of effective cells does not equal the desired number of bits to be output from the system 700), or if the PUF bit information has been compromised (e.g., has become known to an unauthorized person), the system 700 may enter the voltage stress mode.

In the voltage stress mode, Vg higher than the normal operational Vg is applied to the cells 100 such that the randomness of the gm for the FETs in the cells 100 is rebuilt.

The reset signal from the controller 702 resets each of the cells 100. The sh_clk and sh_data are clock and data signals respectively for shift registers (described below) having a single stage arrangement in each cell 100. In the detection mode and the read mode, the sh_data is set so that only one stage of the shift register is at a logic high, and the corresponding cells 100 are enabled for the operation. The signal l_r indicates the first run of the detection mode and the read modes. In this regard, the logic status of each cell 100 is saved in a pre-defined register as a reference value. Each subsequent run is compared to the reference value to determine whether the resultant bit values of each run remain stable.

The buffer portion 708 outputs the signal "full" when a number of effective bits obtained by the buffer portion 708 reaches a desired number (e.g., 128 bits). The "full" signal indicates to the controller that the stability monitor procedure (read procedure) has been completed. If the controller sends N number of clock pulses, the "full" signal does not indicate that the buffer is full, then the randomness of the cells 100 is not satisfactory, and the system may enter the voltage stress mode.

The t_S signals are received by the controller 702 from the temperature sensor portion 710.

Figure 8:
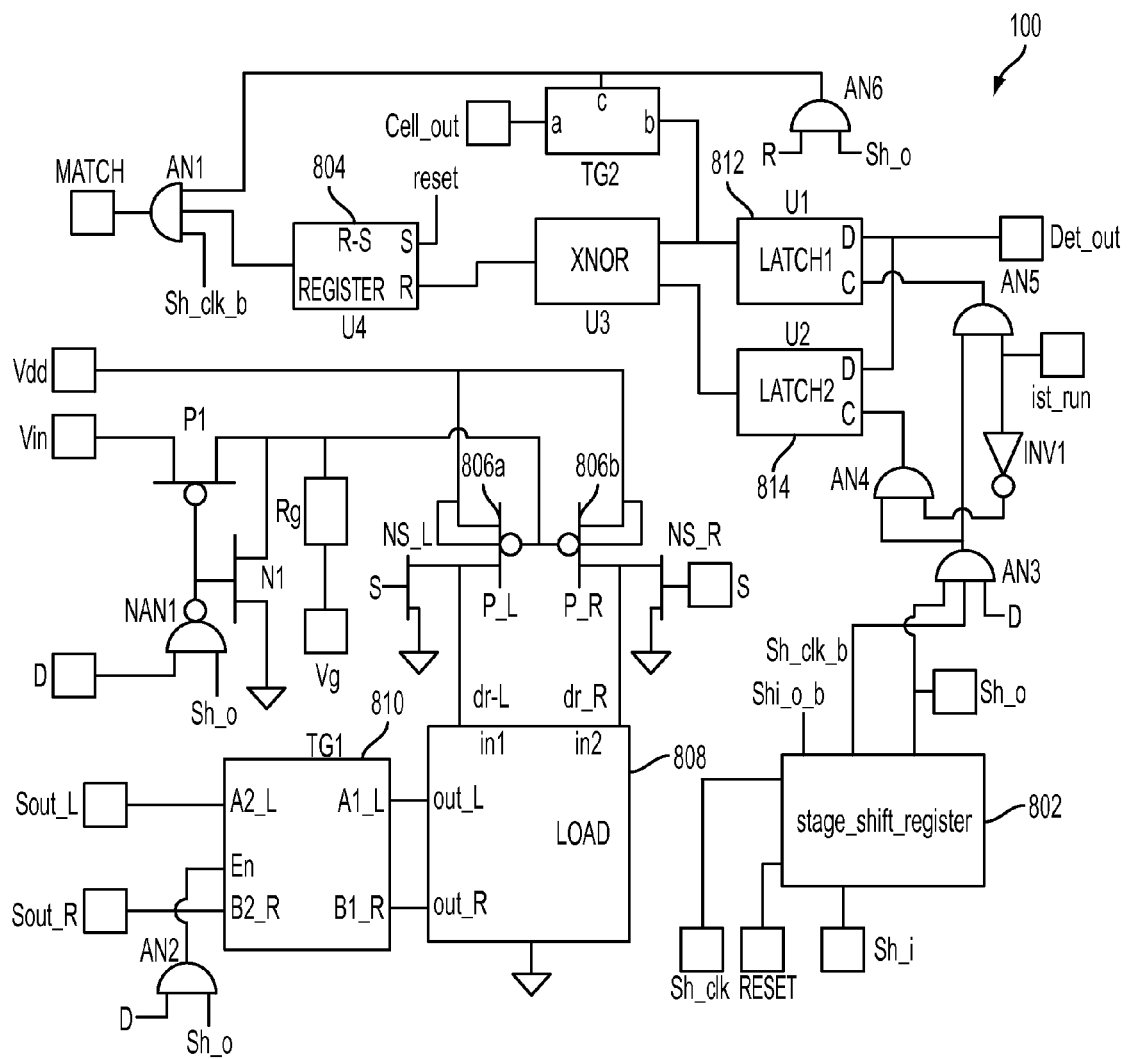
FIG. 8 illustrates a circuit diagram of an exemplary embodiment of a cell.

FIG. 8 illustrates a circuit diagram of an exemplary embodiment of a cell 100. In this regard the cell 100 is arranged for D-gm detection. In this regard, the single stage of the shift register 802 when set to a logic low by a "reset" signal forces the output of the R-S register 804 to logic high. The clock of Sh_clk shifts the logic status of the input of Sh_i to the output of Shi_o. When the Sh_o is at logic high, the cell 100 is enabled. The detection for D at logic high or the readout for R at logic high may then be implemented. The use of a single stage of the shift register for each cell allows only one cell 100 to operate at a time, which reduces interference.

P_L and P_R are the PFETs 806a and 806b respectfully. To obtain a desired variation between the pFETS 806a and 806b, pFETS having a high threshold voltage and minimum but nominally identical size are selected. The gates of the pFETs 806a and 806b are connected together and the gate voltage is set by Vg through the resistor Rg. The gate voltage affects the gm random variation and the absolute gm difference between the pFETs 806a and 806b.

P1 and N1 are the switch FETS. During detection mode with the cell 100 enabled, both D and Sh_o are at logic high, the output of the NAN1 gate is at logic low, the P1 is turned on, N1 is turned off, and the gates of P_L and P_R are connected to the input AC signal pin of Vin. Otherwise, the pFETs 806a and 806b are disconnected from the Vin.

NS_L and NS_R are two nominally identical nFETs that have drains connected to the drains of the pFETs 806a and 806b respectively. During the voltage stress mode, the signal at pin S is at logic high, which turns on NS_L and NS_R, the drains of pFETs 806a and 806b are connected to 0V and the voltage of Vdd is increased about 1.5 times the normal operational voltage.

When the system 700 generates bits, the controller 702 secures the voltage of each component with the exception of the buffer portion 708 to reduce aging of the devices. The drains of the pFETs 806a and 806b are connected to the load portion 808. The load portion 808 may include, for example, a resistive load, a pair of FETs, or simple connections. If simple connections are used, a pair of transimpedance amplifiers may be included in the detector portion 706.

The load portion 808 is connected to a dual channel transmission gate portion 810 that outputs signals Sout_L and Sout_R. The feedback logic is saved in the latches 812 and 814. In operation if the run is the first run, the $1^{st}$_run signal is high, and the latch 812 saves the first run feedback. If the run is not the first run, the $1^{st}$_run signal is low, and the latch 814 saves the logic. The outputs of the latches 812 and 814 may be compared, and if the logic in the latches 812 and 814 is not the same, the match pin 816 will not transition states, indicating the cell 100 is not stable, and the buffer portion 708 (of FIG. 7) will not read the logic status from cell_out.

Figure 9:
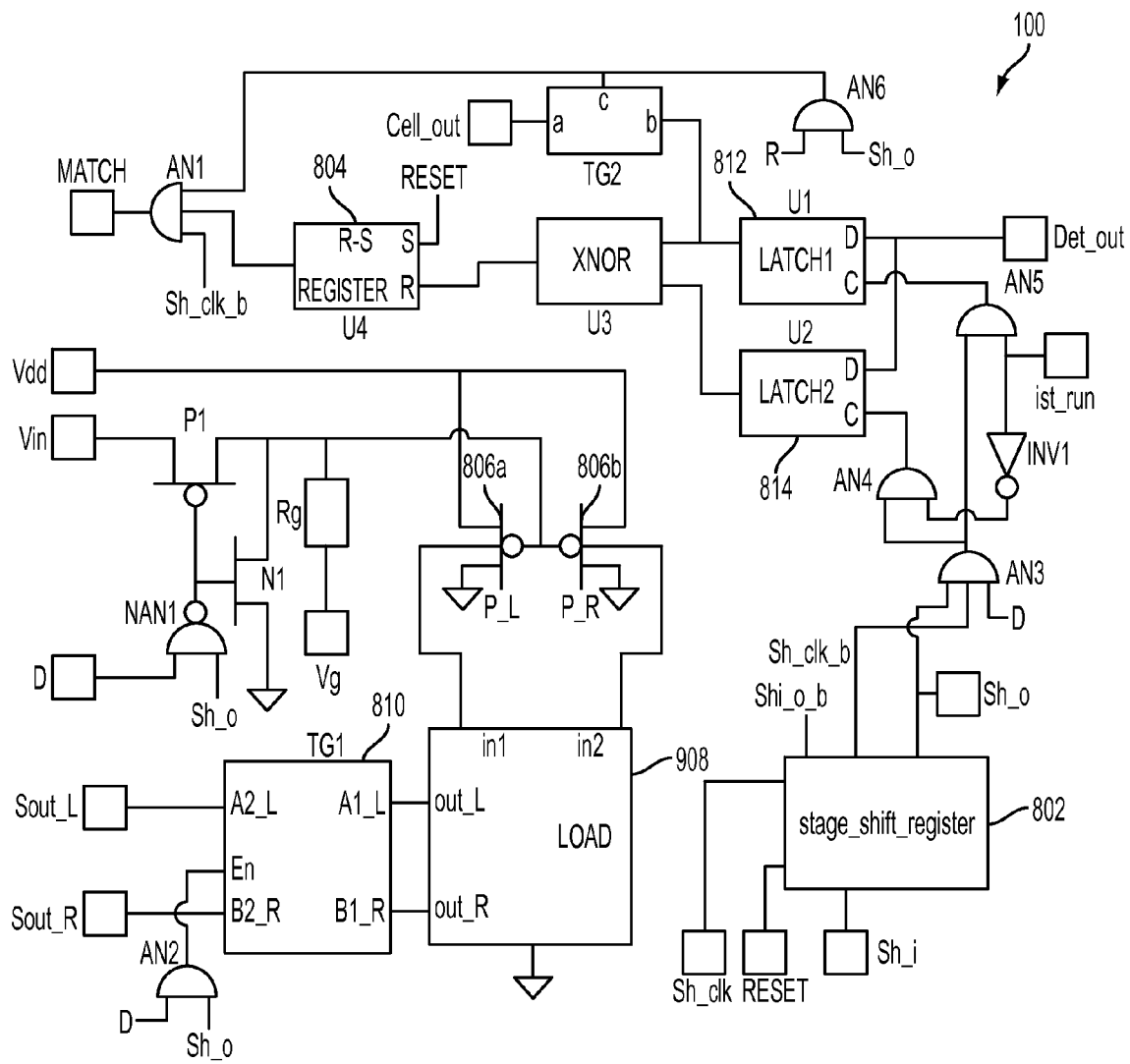
FIG. 9 illustrates an alternate exemplary embodiment of a cell that is arranged for B-gm, body leakage (BL) operation.

FIG. 9 illustrates an alternate exemplary embodiment of a cell 100 that is arranged for B-gm operation. In this regard, the cell 100 of FIG. 9 is similar to the cell 100 of FIG. 8, however the drain of the pFETs 806a and 806b are connected directly to 0V. The load portion 908 is connected to the body of the pFETs 806a and 806b, and the NS_L and NS_R (of FIG. 8) are not used.

Figure 10:
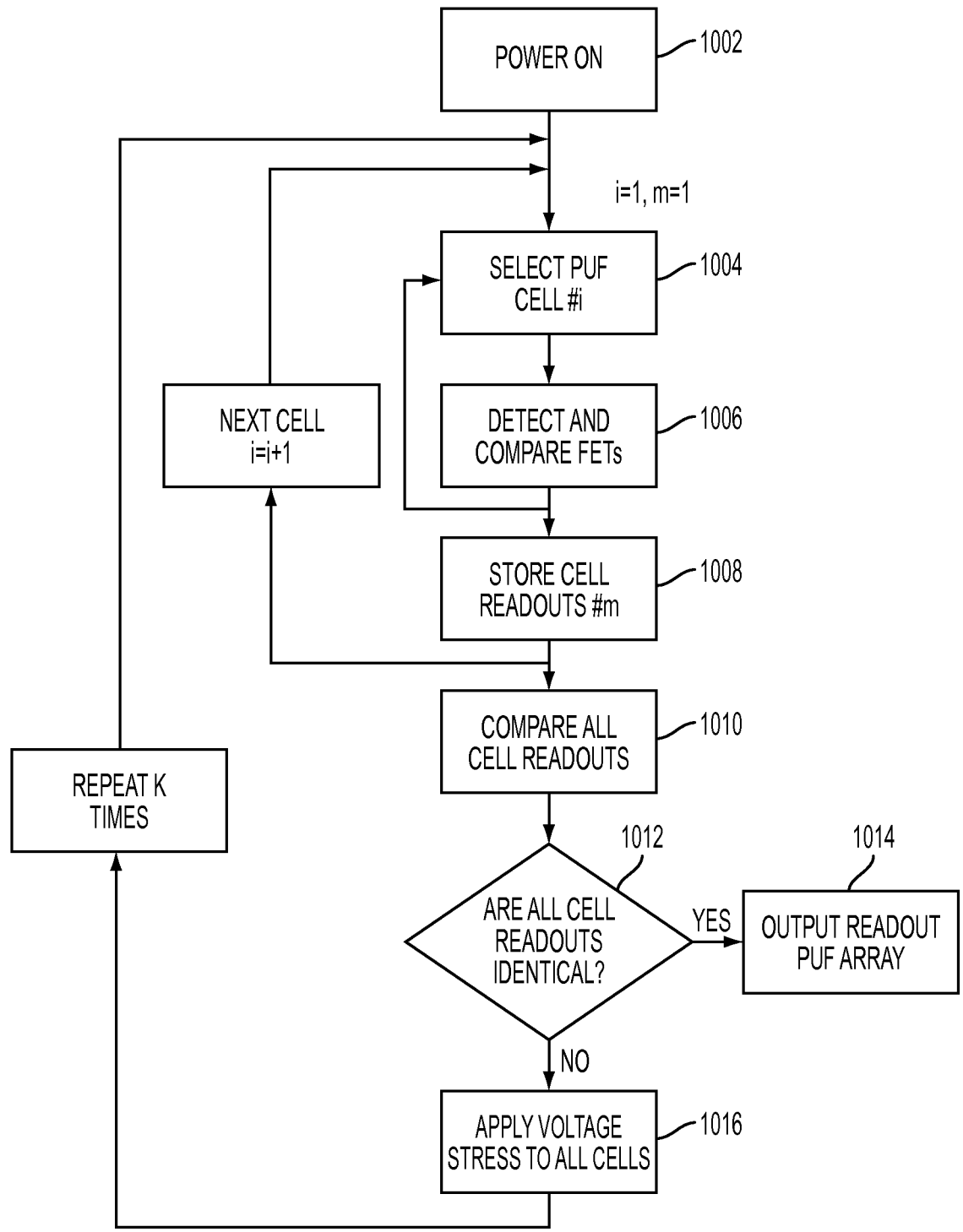
FIG. 10 illustrates a block diagram of an exemplary method of operation of the system of FIG. 6.

FIG. 10 illustrates a block diagram of an exemplary method of operation of the system 600 (of FIG. 6). In block 1002, the system 600 receives power. In block 1004, a cell i is selected. In block 1006, the FETs in the selected cell are detected and compared. The cell readouts m are stored in block 1008. In block 1010, the cell readouts are compared. If all the cell readouts are identical in block 1012, the readout of the PUF is output in block 1014. If not, in block 1016, the cells are stressed. The steps are repeated K times following block 1016.

The methods and systems described above offer a PUF system that includes substantially similar or substantially identical arrays of PUF cells that may be fabricated on any number of chips, and for particular Vin and Vg signals, the binary outputs should be substantially or effectively random due to the random nature of the variances of the transconductance factors of each of the FETs in the PUF cells fabricated on the chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:
1. A function cell comprising:
a first field effect transistor (FET) device;
a second FET device;
a first node connected to a gate terminal of the first FET device and a gate terminal of the second FET device, wherein the first node is operative to receive a voltage signal from an alternating current (AC) voltage source;
an amplifier portion connected to the first FET device and the second FET device, the amplifier portion operative to receive a signal from the first FET device and the second FET device;

a phase comparator portion having a first input terminal connected to an output terminal of the amplifier and a second input terminal operative to receive the voltage signal from the AC voltage source, the phase comparator portion operative to output a voltage indicative of a bit of a binary value.

2. The cell of claim 1, wherein the first FET device and the second FET device are substantially similar.

3. The cell of claim 1, wherein the first FET device has a first transconductance factor (gm) and the second FET device has a second gm.

4. The cell of claim 3, wherein the voltage indicative of a bit of a binary value corresponds to a difference between the first gm and the second gm.

5. The cell of claim 1, wherein the first node is connected to a direct current (DC) voltage source.

6. The cell of claim 1, wherein the cell includes a single stage of a shift register portion operative to store the bit.

7. The cell of claim 6, wherein the single stage of a shift register portion operative to store the bit is operative to store a first bit received from the phase comparator portion in a first latch of the shift register portion and store a second bit received from the phase comparator portion in a second latch of the shift register, the second bit output by the phase comparator portion after the first bit is output from the phase comparator portion.

8. The cell of claim 7, wherein the cell includes a detector portion operative to determine whether the first bit is the same as the second bit.

9. The cell of claim 7, wherein the cell is operative to output a signal indicating that the first bit is the same as the second bit, and output the value of the bits responsive to determining that the first bit is the same as the second bit.

10. The cell of claim 1, wherein the cell defines a portion of a cell array including a plurality of cells, wherein each cell is operative to output a bit of the binary value.

11. The cell of claim 10, wherein the binary value is a unique identifier of the cell array.

12. The cell of claim 10, wherein the binary value is partially dependent on the voltage signal from the AC voltage source.

13. A method for operating a function cell system, the method comprising:
supplying the same common AC voltage to a first FET device and a second FET device;
detecting a transconductance factor (gm) of the first FET device in a first cell of the system and a gm of the second FET device in the first cell of the system;
determining whether the gm of the first FET device is greater than the gm of the second FET device based on a comparison between a phase of outputs generated by the first and second FETS and a phase of the AC voltage;
outputting a first voltage signal from the first cell of the system indicating that the gm of the first FET device is greater than the gm of the second FET device responsive to determining that gm of the first FET device is greater than the gm of the second FET device.

14. The method of claim 13, further comprising:
outputting a second voltage signal from the first cell of the system indicating that the gm of the first FET device is less than the gm of the second FET device responsive to determining that gm of the first FET device is not greater than the gm of the second FET device.

15. The method of claim 13, wherein the output first voltage signal represents a value of a first bit of a binary value.

16. The method of claim 13, further comprising:
detecting a transconductance factors (gm) of a first FET device and second FET device in a plurality of cells of the system;
determining whether the gm of the first FET is greater or less than the gm of the second FET device in a plurality of cells of the system; and
outputting voltage signals responsive to determining that the gm of the first FET device is greater or less than the gm of the second FET device in a plurality of cells of the system.

17. The method of claim 16, wherein the output voltage signals from a plurality of cells of the system represent the bits of a binary value.

18. A method for operating a function cell system, the method comprising:
providing power to the system;
initiating a reading process comprising:
selecting a first cell from a plurality of cells in the system;
detecting and comparing a transconductance factor (gm) of a first FET device and a second FET device in the first cell;
receiving a first bit value from the first cell indicative of the comparison of the gm of the first FET device and the second FET device of the first cell;
storing the first bit value associated with the first cell;
detecting and comparing a transconductance factor (gm) of a first FET device and a second FET device in the first cell, the detecting based on based on a comparison between a phase of outputs generated by the first and second FETS and a phase of the AC voltage;
receiving a second bit value from the first cell indicative of the comparison of the gm of the first FET device and the second FET device of the first cell;
determining whether the first bit value is the same as the second bit value;
stressing a first FET device and a second FET device in the first cell if the first bit value is not the same as the second bit value; and
outputting the first bit value responsive to determining that the first bit value is the same as the second bit value.

19. The method of claim 18, wherein the reading process further comprises:
selecting a second cell from a plurality of cells in the system;
supplying the same common AC voltage to a first FET device and a second FET device;
detecting and comparing a transconductance factor (gm) of the first FET device and the second FET device in the second cell;
receiving a first bit value from the second cell indicative of the comparison of the gm of the first FET device and the second FET device of the second cell;
storing the first bit value associated with the second cell;
detecting and comparing a transconductance factor (gm) of a first FET device and a second FET device in the second cell;
receiving a second bit value from the second cell indicative of the comparison of the gm of the first FET device and the second FET device of the second cell;
determining whether the first bit value is the same as the second bit value;
stressing a first FET device and a second FET device in the first cell if the first bit value is not the same as the second bit value; and outputting the first bit value associated with the second cell responsive to determining that the first bit value is the same as the second bit value.

20. The method of claim 18, wherein the first bit value is a bit of a binary value including a plurality of bit values.

* * * * *